United States Patent [19]
Moussie

[11] 4,115,711
[45] Sep. 19, 1978

[54] THRESHOLD CIRCUIT WITH HYSTERESIS

[75] Inventor: Michel Moussie, Caen, France

[73] Assignee: U.S. Philips Corporation, New York, N.Y.

[21] Appl. No.: 815,266

[22] Filed: Jul. 13, 1977

Related U.S. Application Data

[63] Continuation of Ser. No. 674,882, Apr. 8, 1976, abandoned.

[30] Foreign Application Priority Data

Apr. 22, 1975 [FR] France .................. 75 12480

[51] Int. Cl.² .............................. H03K 5/20
[52] U.S. Cl. .................. 307/350; 307/303;
307/363; 357/38; 357/44; 357/48; 357/92

[58] Field of Search ............... 307/363, 288, 303, 313,
307/290, 252 A, 252 G, 252 T, 255, 252 R, 305,
350; 357/38, 44, 46, 92

[56] References Cited
U.S. PATENT DOCUMENTS 2,957,091  10/1960  Pace .................................. 307/288

Primary Examiner—John Zazworsky
Assistant Examiner—Marcus S. Rasco
Attorney, Agent, or Firm—Frank R. Trifari; Daniel R. McGlynn

[57] ABSTRACT

A hysteresis threshold circuit including two complementary transistors and an output transistor with an injector controlled by the collector of the second complementary transistor. The emitters of the second transistor and of the output transistor are interconnected, while the input of the circuit is constituted by the emitter of the first complementary transistor.

10 Claims, 5 Drawing Figures

THRESHOLD CIRCUIT WITH HYSTERESIS

This is a continuation of application Ser. No. 674,882, filed Apr. 8, 1976, now abandoned.

The present invention relates to a threshold circuit with hysteresis, which comprises at least two complementary transistors and one output transistor, the base of each complementary transistor being connected directly to the collector of the other transistor.

Integrated logic circuits are known of the DCTL type (direct coupled transistor logic), whose basic element is a driven transistor connected in common-emitter arrangement, whose base current is injected via a resistor. Under the name I²L (injected integrated logic) improved circuits of this type are known in which the current is injected into the base with the aid of a transistor which is complementary of the driven transistor which is connected in common base arrangement.

These circuit arrangements are characterized by very low operating voltages and currents; their low operating voltages render these circuits very sensitive to interference signals and make it necessary to improve their immunity to noise as far as possible, specifically in the case of connections between modules which introduce substantial interference signals.

A known method of improving the noise immunity in logic circuits which comprise various stages is the use, for example, at the input of a stage, of a threshold circuit with hysteresis, which produces signals with steep leading edges when the input signal clears either a rising threshold or a descending threshold, which are separated by a spacing which determines the hysteresis. The immunity to noise is then on the one hand the difference between the low logic level and the rising threshold, and on the other hand the difference between the high logic level and the descending threshold, the rising threshold being substantially higher than the descending threshold.

However, threshold circuits with hysteresis of the known type, such as the Schmitt trigger, see for example "Pulse Electronics," by Littauer, McGraw-Hill 1965, pages 381–390, comprise resistors and are not compatible with integrated circuits with current injection. The voltage drops required across the load resistors would necessitate the use of resistors of too high values if allowance is made for operating currents of the order of Nanoamperes. Furthermore, the arrangement which improves the noise immunity should not introduce a time constant which would affect the advantages of the circuit in respect of speed and power consumption.

Another substantial advantage of current injection circuits is the very high component density per unit of surface area, which allows a large number of stages to be accommodated on the same crystal. The use of Schmitt triggers of the known type would substantially reduce the advantages of these circuits in this respect.

It is in particular the object of the present invention to mitigate the drawbacks of known arrangements and to provide a threshold circuit with hysteresis which is compatible with current-injection integrated circuits and whose immunity to noise can be improved.

It is a further object of the invention to provide a threshold circuit with hysteresis which ensures a high immunity to noise in an interface circuit between current-injection circuits or between a TTL circuit (transistor-transistor logic) and a current-injection circuit realized on different chips, or between a mechanical device and an I²L circuit.

According to the invention, a threshold circuit with hysteresis, which comprises at least two complementary transistors and one output transistor, the base of each complementary transistor being connected directly to the collector of the other transistor, is characterized in that the emitter of the first complementary transistor is connected to the input of the circuit, the collector of the second complementary transistor drives the base of a current-injection output transistor of the same type as the second complementary transistor, the emitter of this second transistor and the emitter of the output transistor being coupled directly to a common voltage reference point.

The operating voltages and currents render the device compatible with logic circuits with current injection. The hysteresis is obtained in a manner described hereinafter, the operation being described with reference to the accompanying drawings.

The invention will be described with reference to the drawing.

Figure 1:
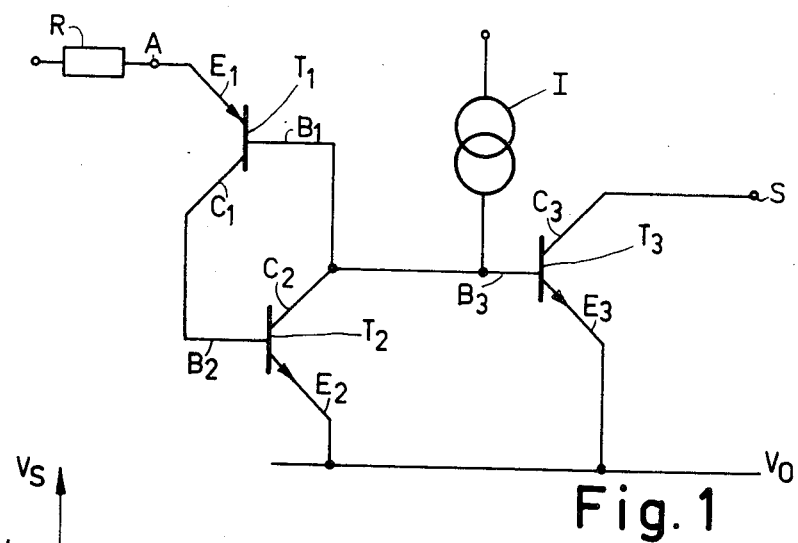
FIG. 1 represents a threshold circuit according to the invention.
Figure 2:
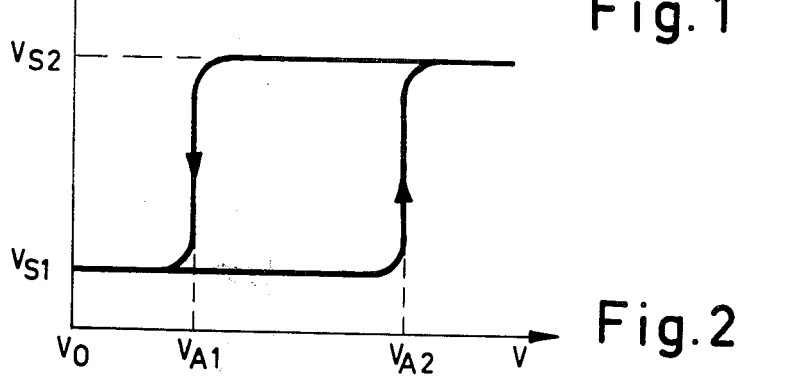
FIG. 2 shows a diagram of the hysteresis effect which can be obtained.

In FIG. 1 $T_1$ and $T_2$ are two complementary transistors, and $T_3$ is the NPN-type output transistor of the circuit. The input of the circuit is located at point A. R representing a resistive element via which the input signal is applied. The collector $C_1$ of $T_1$ is connected to the base $B_2$ of $T_2$ and the collector $C_2$ of $T_2$ is connected to the base $B_1$ of $T_1$. $T_3$ is provided with a current injector I, for example a transistor. At S on the collector $C_3$ of the transistor $T_3$ an output of the circuit is located, the emitters $E_2$ of $T_2$ and $E_3$ of $T_3$ being connected to earth.

If the input voltage $V_A$ at point A is substantially zero, the complementary input transistor $T_1$ of the PNP-type is not conductive because it is not energized. The other complementary transistor $T_2$ of the NPN-type is neither energized and is therefore not conductive. Since the two transistors $T_1$ and $T_2$ are non-conductive, the current injected by the current injector I of the transistor $T_3$ can only pass via the last-mentioned transistor. The voltage between the collector $C_3$ and the emitter $E_3$ of the output transistor, which defines the output level at S is a minimum. If the input voltage $V_A$ increases, transistor $T_1$ becomes conductive when the voltage between its base $B_1$ and point A exceeds the internal voltage $V_{BE1}$ at the emitter-base junction of this transistor $T_1$. As the base emitter paths of two transistors $T_1$ and $T_3$ are arranged in series and are of opposite conductivity types, the two internal voltages $V_{BE1}$ and $V_{BE3}$ are to be added to each other. When the input voltage $V_A$ thus reaches the value $V_{BE1} + V_{BE3} = V_{A2}$, transistor $T_1$ becomes conductive and drives $T_2$ which also becomes conductive, the voltage at the base $B_3$ of the output transistor $T_3$ drops to the value of the internal voltage $V_{CE2}$ between the collector $C_2$ and the emitter $E_2$ of the transistor $T_2$, and the transistor $T_3$ is cut off. The output voltage $V_S$ increases again to a high level $V_{S2}$. The value of the input voltage $V_{BE1} + V_{BE3} = V_{A2}$ thus constitutes a rising threshold which determines the transition of the output voltage $V_S$ from a low level $V_{S1}$ to a high level $V_{S2}$.

If the input voltage $V_A$ decreases from a value which is higher than the rising threshold $V_{A2}$, the state of the system will not change as long as this input voltage remains higher than the value $V_{BE1} + V_{CE2} = V_{A1}$ below which the assembly of the two complementary transistors can no longer conduct. The value of the input voltage $V_{BE1} + V_{CE2} = V_{A1}$ (or the substantially equivalent value $V_{C1} + V_{BE2}$ of the collector-emitter voltage of $T_1$, added to the internal saturated voltage at the base-emitter junction of $T_2$) thus constitutes a descending threshold which determines the transition of the output voltage from the high level $V_{S2}$ to the low level $V_{S1}$, the system resuming its previous state.

The rising and the descending threshold differ by the amount:

$$(V_{BE1} + V_{BE3}) - (V_{BE1} + V_{CE2}) = V_{BE3} - V_{CE2}.$$

It is known that for bipolar transistors realized in a silicon wafer in accordance with conventional integrated circuits techniques the value of a $V_{BE}$ voltage of a conducting transistor is approximately 0.7 V, that of a $V_{CE}$-voltage is approximately 0.2 V, so that the difference between the thresholds or the value of the hysteresis effect of the circuit which is integrated on the silicon chip is of the order of 0.5 V. As the input and output voltages of the circuit when used in conjunction with current injection circuits, correspond to logic voltage swings of the order of 2 V, the noise immunity realized by the circuit is relatively substantial and is obtained with a minimum number of components.

The input resistor, denoted by R in FIG. 1, may simply be constituted by the internal resistance of the input signal source, or at least be integrated in the input stage of the circuit arrangement.

When the circuit is integrated, the input transistor is preferably of the PNP-type and the transistor which is its complement as well as the output transistor are of the NPN-type. The device is thus directly compatible with I²L circuits as generally realized.

In accordance with a preferred embodiment the PNP-type input transistor is a planar transistor of lateral structure, obtained by planar diffusion technology in an island which is isolated from a silicon crystal, and the NPN type complementary transistor is a planar transistor of vertical structure obtained in accordance with the same technique, the base region of the PNP-transistor and the collector region of the NPN-transistor form a single region, and the base region of the NPN-transistor and the collector region of the PNP-transistor form a single region. A P/N-junction separates said single regions. The assembly of the two complementary transistors is realized in the same isolated island by a P/N junction, the output transistor and its injector being realized in an adjacent island, and the connection between the collector of the complementary NPN transistor at the base of the output transistor being realized by means of a conductor track at the surface of the chip. The complete device can be realized simultaneously with other integrated circuit elements on the same chip. This does not increase the number and complexity of the operations to be performed.

Suitably, the element for the injection of charge carriers into the base of the output transistor is a planar PNP-transistor of the lateral type, whose collector is constituted by the base of the output transistor, the last-mentioned transistor being of the inverted vertical type with an emitter constituted by the base of the lateral PNP-transistor. As this arrangement corresponds to the I²L technique, it has all the advantages of said technique.

Similarly, the injector of the output transistor may be a planar transistor of lateral structure which is isolated and whose base is at a fixed voltage.

It is evident that the output transistor of the structure which has just been described, may comprise several collectors, which are constituted by different regions diffused in the base region.

In accordance with an advantageous embodiment of the circuit according to the invention, the main current path of an additional transistor with injector and of the same type as the first complementary transistor, is connected in parallel with the base-emitter junction of the second complementary transistor.

The transistor with injector, which preferably conducts permanently, diverts the current supplied by the first complementary transistor as soon as said last-mentioned transistor becomes conductive when the input voltage increases. The second complementary transistor does not become conductive until the current supplied by the first complementary transistor drives the additional transistor with injector out of its saturation range. Thus, a higher rising threshold is obtained and consequently a greater difference between the thresholds, and a better immunity to noise. Moreover, the change of the second complementary transistor from the conductive state to the non-conductive state is more rapid, the charges stored in the base then being drained via the additional transistor with injector.

The additional transistor with injection preferably has a structure of the I²L type.

The invention is in particular applicable to assemblies of logic circuits whose signals correspond to very small voltage swings. The structure is particularly suitable for application to circuits of the I²L of DCTL type, specifically in the connections between modules.

A planar structure of the I²L type of a circuit according to the invention is described with reference to FIGS. 3 and 4, the injector of the output transistor being constituted by a lateral PNP-transistor.

A P-type silicon substrate 31 is covered by an epitaxial N-type layer 32. The layer 32 comprises islands which are isolated by means of a network of P⁺-type isolation zones 35. N⁺-type buried layers 33 constitute the bottom of the islands. In the island 34 P-type regions are diffused: a region $E_1$ which forms the emitter of the input transistor $T_1$ whose base $B_1$ is bounded by the island 34, and a region $C_1$ which forms the collector of said transistor $T_1$ and at the same time the base $B_2$ of the NPN transistor $P_2$. The collector $C_2$ of the last-mentioned transistor is bounded by the island 34 and its emitter $E_2$ is constituted by an N⁺-type region which is diffused into the base $B_2$.

Outside the island 34 beyond the isolation zone 35, the output transistor $T_3$ and its injector comprise the emitter $E_3$ of the transistor $T_3$ constituted by the epitaxial layer 32, the P-type base $B_3$ of the transistor $B_3$, which is diffused into the layer 32, the N⁺-type collector $C_3$ of said transistor, which is diffused into the base $B_3$. The base $B_3$ at the same time constitutes the collector of an injection transistor whose base is formed by the emitter $E_3$ and whose emitter is a diffused P⁺-type region 37 located near the region $B_3$. The output transistor T₃ is shown with a single collector, but it is evident that it may comprise more than one collector.

The connections between the circuit elements and to external elements are made by means of conductor tracks deposited on the surface of the device.

Figure 4:
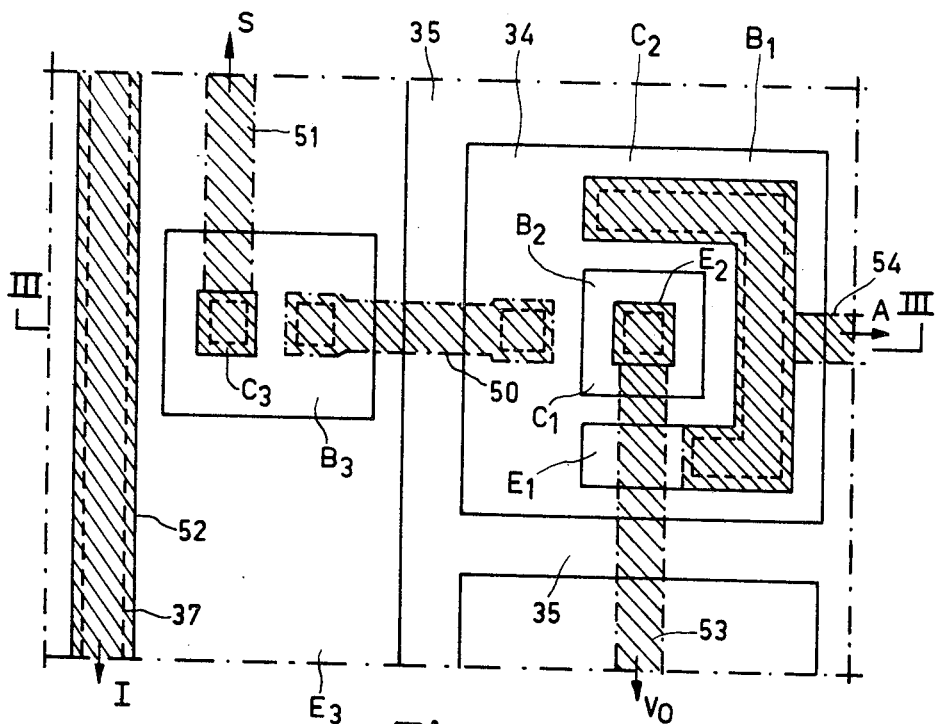
FIG. 4 is a plan view of the circuit of FIG. 3.

In the plan view of FIG. 4, the dashed lines correspond to contact openings, the uninterrupted lines correspond to the boundaries of the diffused regions, and the dash-dot lines to the delimitations of the conductor tracks.

The emitter E₁ receives the input signals via a conductor track 54 which connects it to an input terminal. The emitter E₂ is connected to a voltage reference point, generally the bulk of substrate 31, via a conductor track 53. The collector C₂ is connected to the base B₃ via a conductor track 50, which is schematically represented by an uninterrupted line 36 in FIG. 3. The collector C₃ is connected to an output terminal 5 via a conductor track 51 or preferably to the input of an stage which is controlled by the transistor T₃. The region 37 receives the injection current via a conductor track 52, which may also supply other elements of the same structure.

Figure 3:
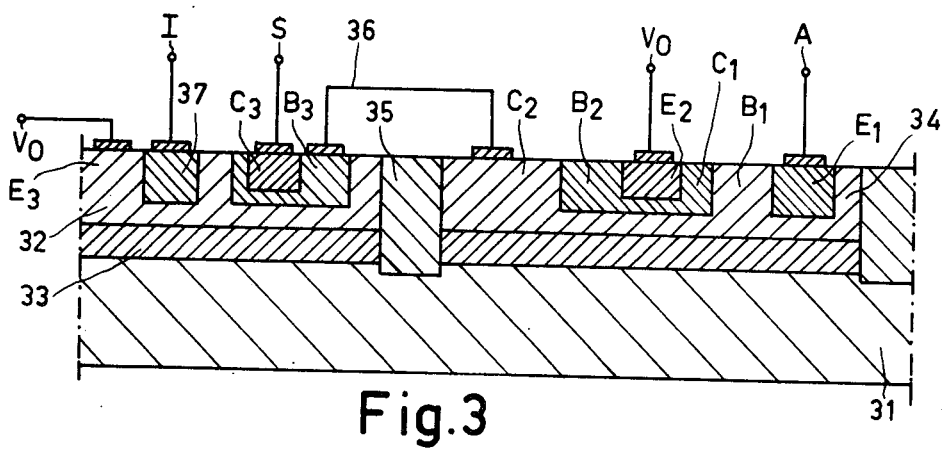
FIG. 3 is a partial schematic cross-section in accordance with III—III of a circuit in accordance with the invention.
Figure 5:
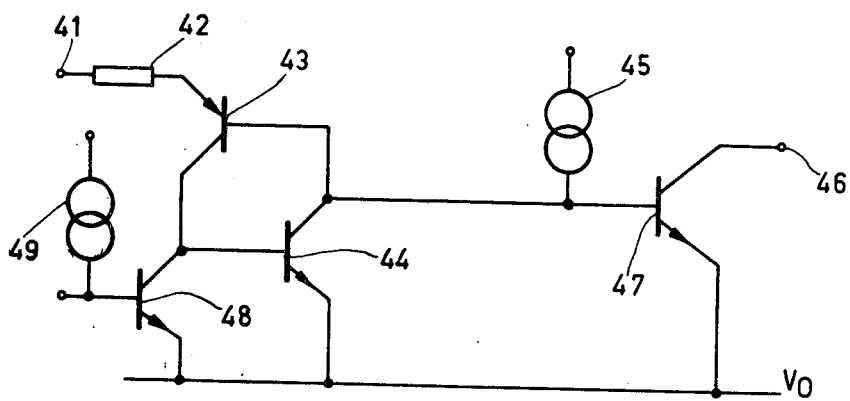
FIG. 5 is a diagram of a circuit which is perfected by an additional transistor with injector.

FIG. 5 is the diagram of a device which comprises the same elements as the devices of FIGS. 1, 3 and 4 but which in addition comprises a transistor with injector which serves to improve the performance. The input of the device is at 41, the resistor 42 representing the resistance via which the source applies the input signals, the first complementary transistor being designated 43 and the second 44. A transistor 48 is added to divert the collector current of the transistor 43 when said transistor becomes conductive. The additional transistor 48 is provided with an injector 49. An output transistor 47 is also provided with an injector 45 and the output is located at point 46.

It is to be noted that the invention is not limited to the embodiments described and that to those skilled in the art many variations are possible within the scope of the invention. Other semiconductor materials such as germanium may be used and the conductivity types may be interchanged if simultaneously the signs of the polarities of the potentials to be applied are reversed. Furthermore other arrangements and/or other geometric shapes may be used in the lay-out.

What is claimed is:

1. A threshold circuit with hysteresis comprising:
    an input;
    planar complementary first and second transistors and an output third transistor each having an emitter, base and collector; a current injector for supplying current to said output transistor; said base of each of said complementary first and second transistors being connected directly to the collector of the other complementary transistor; said emitter of said first transistor being connected to said input of the circuit; said collector of said second transistor connected to said base of said third transistor in a d.c. path, said collector of said second transistor and said base of said third transistor being of opposite conductivity type; said emitter of said second transistor and said emitter of said third transistor being coupled directly to a common voltage reference point; and
    an output connected to the collector of said third transistor.

2. A threshold circuit as claimed in claim 1, wherein said first complementary transistor is of PNP-type, and said second complementary transistor and said output third transistor are of NPN-type.

3. A threshold circuit as claimed in claim 1, wherein said first transistor has a planar lateral structure, and said second transistor has a planar vertical structure.

4. A threshold circuit as claimed in claim 1, wherein said circuit is implemented in a common semiconductor body, and said two complementary transistors are located in an electrically isolated island in said common semiconductor body.

5. A threshold circuit as claimed in claim 4, wherein said base of said first complementary transistor and said collector of said second transistor are formed by a first region, and said collector of said first transistor and said base of said second transistor are formed by a second region.

6. A threshold circuit as claimed in claim 1, wherein said current injector of said third transistor comprises a planar lateral injector transistor having a collector constituted by said base of said third transistor.

7. A threshold circuit as defined in claim 1, wherein said current injector comprises an injector transistor, and third transistor is a vertical inverted transistor having an emitter constituted by the base of said injector transistor.

8. A threshold circuit as claimed in claim 1, wherein said current injector of said third transistor includes a planar lateral transistor having a base maintained at a fixed potential.

9. A threshold circuit as claimed in claim 1, further comprising a fourth transistor of the opposite conductivity type as the conductivity type of said first transistor, and having a main current path connected in parallel with the emitter-base junction of said second complementary transistor.

10. A monolithic semiconductor circuit comprising a semiconductor body provided with an input; a plurality of semiconductor bipolar circuit elements adjacent a major surface thereof, including a first transistor having a planar lateral structure, a a second transistor complementary to said first transistor having a planar vertical structure, an output third transistor, and a current injector for supplying current to said third transistor, said complementary first and second transistors each having an emitter, base and collector zones, said base zone of each of said complementary transistors being adjacent the collector zone of the other complementary transistor; said emitter zone of said first complementary transistor being connected to the input of the circuit; said collector zone of said second complementary transistor driving said base zone of said output transistor, said collector zone of said second transistor and said base zone of said third transistor being of opposite conductivity type; said emitter zone of said second transistor and said emitter zone of said third transistor being coupled to a common voltage reference point, and an output connected to the collector of said third transistor.

* * * * *